(12) United States Patent
Lee et al.

(10) Patent No.: US 7,894,241 B2
(45) Date of Patent: Feb. 22, 2011

(54) MEMORY CELL ARRAY AND SEMICONDUCTOR MEMORY DEVICE INCLUDING THE SAME

(75) Inventors: Yun-Sang Lee, Yongin-si (KR); Woo-Jung Sun, Seoul (KR); Jung-Bae Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 119 days.

(21) Appl. No.: 12/326,940

(22) Filed: Dec. 3, 2008

(65) Prior Publication Data

US 2009/0147559 A1    Jun. 11, 2009

(30) Foreign Application Priority Data

Dec. 10, 2007    (KR) ...................... 10-2007-0127502

(51) Int. Cl.
G11C 7/00    (2006.01)
(52) U.S. Cl. ........................ 365/149; 365/203
(58) Field of Classification Search ................ 365/149, 365/203
See application file for complete search history.

(56) References Cited

U.S. PATENT DOCUMENTS

| | | | |
|---|---|---|---|
| 6,868,023 B2 * | 3/2005 | Takita et al. ................. | 365/203 |
| 6,950,353 B1 * | 9/2005 | Kim et al. .................... | 365/200 |
| 2002/0118588 A1 * | 8/2002 | Kato ........................... | 365/210 |
| 2004/0085844 A1 * | 5/2004 | Arimoto et al. ............. | 365/210 |
| 2004/0174735 A1 * | 9/2004 | Agata ......................... | 365/149 |
| 2006/0023484 A1 * | 2/2006 | Shiga et al. ................. | 365/145 |
| 2006/0152971 A1 * | 7/2006 | Tanizaki et al. ............. | 365/171 |
| 2007/0058414 A1 * | 3/2007 | Hoya et al. ................. | 365/145 |

FOREIGN PATENT DOCUMENTS

| | | |
|---|---|---|
| JP | 11288593 | 10/1999 |
| JP | 2001307479 | 11/2001 |
| JP | 2002050181 | 2/2002 |
| KR | 1020020057356 A | 7/2002 |

* cited by examiner

*Primary Examiner*—Michael T Tran
(74) *Attorney, Agent, or Firm*—Volentine & Whitt, PLLC

(57) ABSTRACT

A memory cell array with open bit line structure includes a first sub memory cell array, a second sub memory cell array, a sense-amplifier/precharge circuit, first capacitors and second capacitors. The first sub memory cell array is activated in response to a first word line enable signal, and the second sub memory cell array is activated in response to a second word line enable signal. The sense-amplifier/precharge circuit is connected to the first sub memory cell array through first bit lines and to the second sub memory cell array through second bit lines, and the sense-amplifier/precharge circuit precharges the first bit lines and the second bit lines and amplifies data provided from the first sub memory cell array and the second sub memory cell array.

19 Claims, 16 Drawing Sheets

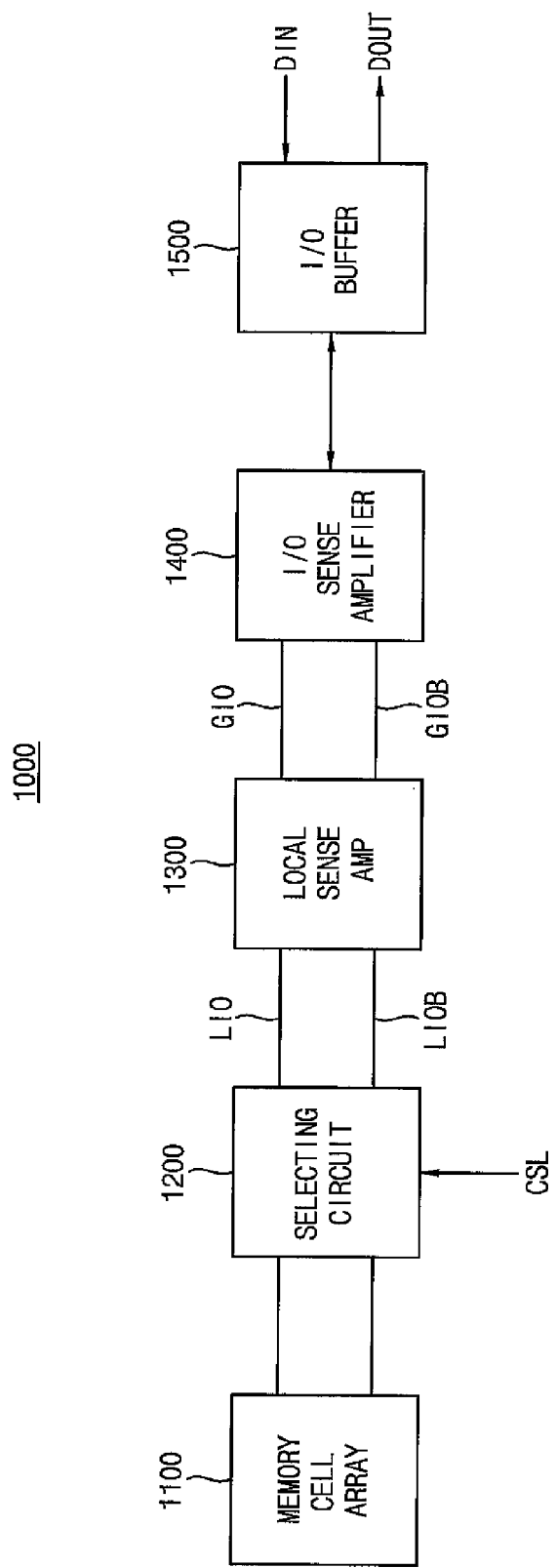

MEMORY CELL ARRAY AND SEMICONDUCTOR MEMORY DEVICE INCLUDING THE SAME

PRIORITY CLAIM

A claim of priority under 35 USC §119 is made to Korean Patent Application No. 2007-0127502, filed on Dec. 10, 2007 in the Korean Intellectual Property Office (KIPO), the contents of which are herein incorporated by reference in their entirety.

SUMMARY

Example embodiments herein generally relate to a semiconductor device, and more particularly, the example embodiments relate to a memory cell array with an open bit line structure, and to a semiconductor memory device which includes such a memory cell array.

Semiconductor memory devices, such as dynamic random access memories (DRAM's), generally include a plurality of memory cell arrays, where each memory cell array includes a plurality of sub memory cell arrays. Depending on the interconnection between sense-amplifiers and bit line pairs, the memory cell arrays are generally characterized as having either an open bit line structure or a folded bit line structure.

In a folded bit line structure, each sense amplifier is connected to a bit line pair of a same sub memory array. In contrast, in an open bit line structure, each sense amplifier is connected to one bit line from a first sub memory array (e.g., positioned to one side of the sense amplifier) and to corresponding other bit line from a second sub memory array (e.g., positioned to other side of the sense amplifier).

In the meantime, when data are read in a semiconductor memory device, an addressed word line is activated by a row decoder, and then data in memory cells connected to the activated word line are transferred to each bit line and amplified by a bit line sense-amplifier. Data in a single bit line among the bit lines is selected in response to a column select signal (CSL), and the selected data is amplified and output by an I/O sense-amplifier.

Prior to word line activation in a read operation, bit line pairs are precharged to a constant voltage level to induce a charge sharing operation in which charges stored in memory cell capacitors and in the bit lines are shared.

Generally, there are three schemes utilized to precharge bit lines, namely, a half-VDD precharge scheme, a full-VDD precharge scheme and a GND precharge scheme. In the half-VDD precharge scheme, bit lines are precharged to a voltage level of half the power supply voltage VDD. In the full-VDD precharge scheme, bit lines are precharged a voltage level of the power supply voltage VDD. In the GND precharge scheme, bit lines are precharged to a voltage level of the ground voltage GND.

As mentioned above, example embodiments herein relate to a memory cell array with an open bit line structure, and to a semiconductor memory device which includes such a memory cell array.

According to some of the example embodiments, a memory cell array with an open bit line structure includes a first sub memory cell array, a second sub memory cell array, a sense-amplifier/precharge circuit, first capacitors and second capacitors. The first sub memory cell array is activated in response to a first word line enable signal, and the second sub memory cell array is activated in response to a second word line enable signal. The sense-amplifier/precharge circuit is connected to the first sub memory cell array through first bit lines and connected to the second sub memory cell array through second bit lines, and the sense-amplifier/precharge circuit precharges the first bit lines and the second bit lines and amplifies data provided from the first sub memory cell array and the second sub memory cell array. Each of the first capacitors is connected between a first dummy word line and each of the second bit lines, and the first capacitors boost the second bit lines in response to the first word line enable signal. Each of the second capacitors is connected between a second dummy word line and each of the first bit lines, and the second capacitors boost the first bit lines in response to the second word line enable signal.

According to other example embodiments, a semiconductor memory device includes a memory cell array, a selecting circuit, an I/O sense-amplifier and an I/O buffer. The memory cell array, when first data in true cells connected to bit lines are read, increases a voltage level of complementary bit lines connected to complementary cells and then senses and amplifies the first data. The selecting circuit selectively provides output data of the memory cell array in response to a column selecting signal. The I/O sense-amplifier amplifies output data of the selecting circuit, and the I/O buffer buffers output data of the I/O sense-amplifier and generates output data.

BRIEF DESCRIPTION OF THE DRAWINGS

Illustrative, non-limiting example embodiments will be more clearly understood from the detailed description that follows in conjunction with the accompanying drawings.

FIG. 20 is a block diagram illustrating a DRAM device that includes a memory cell array according to an example embodiment.

DETAILED DESCRIPTION OF THE EMBODIMENTS

Figure 1:
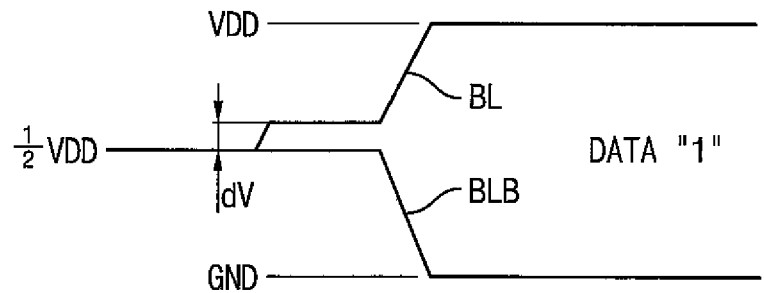
FIGS. 1 and 2 are diagrams illustrating a reading operation of a DRAM device that uses half-VDD precharge scheme.

Various example embodiments will be described more fully with reference to the accompanying drawings, in which some example embodiments are shown. The present invention may, however, be embodied in many different forms and should not be construed as limited to the embodiments set forth herein. Rather, these embodiments are provided so that this disclosure will be thorough and complete, and will fully convey the scope of the present invention to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
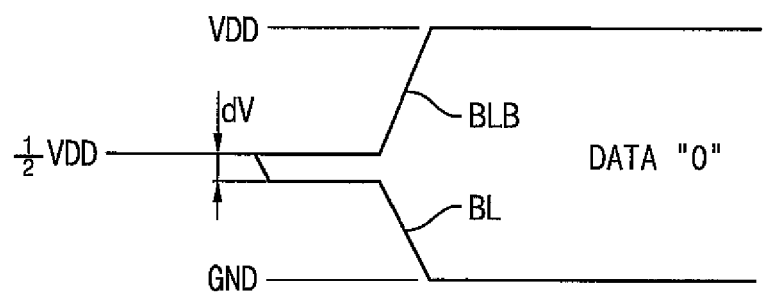

FIG. 1 is a diagram for use in explaining a reading operation of a DRAM device that uses a half-VDD precharge scheme, in the case where the read data is logic "1". FIG. 2 is a diagram for use in explaining a reading operation of a DRAM device that uses half-VDD precharge scheme, in the case where the read data is logic "0".

As illustrated in FIG. 1, in a DRAM device that uses a half-VDD precharge scheme, if a read data is "1", a voltage of a bit line BL increases by dV from the precharged ½ VDD and a complementary bit line BLB remains at the ½ VDD. After a sense amplifier amplifies the voltage levels, the bit line BL is at the power supply voltage VDD and the complementary bit line BLB is at the ground voltage GND.

As illustrated in FIG. 2, in a DRAM device that uses half-VDD precharge scheme, if a read data is "0", a complementary bit line BLB remains at the precharged ½ VDD and a voltage of a bit line BL decreases by dV from the ½ VDD. After a sense amplifier amplifies the voltage levels, the complementary bit line BLB is at the power supply voltage VDD and the bit line BL is at the ground voltage GND.

Figure 3:
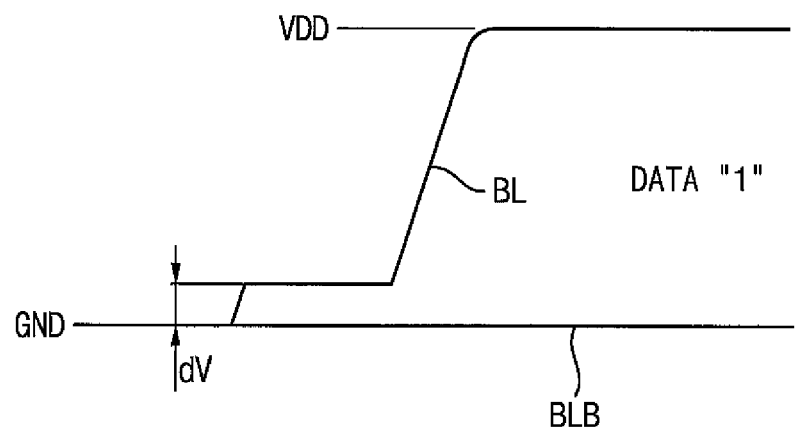
FIGS. 3 and 4 are diagrams illustrating a reading operation of a DRAM device that uses GND precharge scheme.
Figure 4:
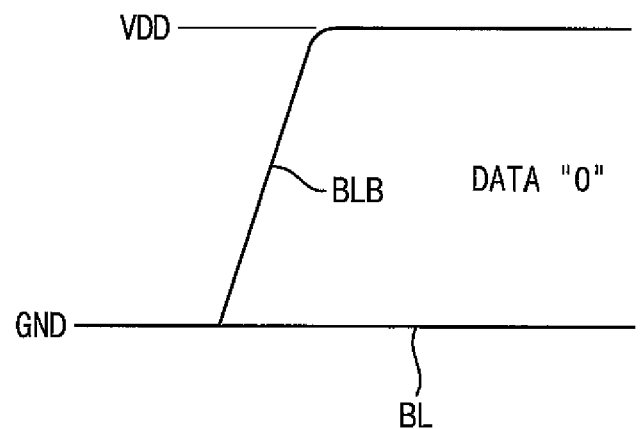

FIG. 3 is a diagram for use in explaining a reading operation of a DRAM device that uses a GND precharge scheme, in the case of read data "1", and FIG. 4 is a diagram illustrating a reading operation of a DRAM device that uses a GND precharge scheme, in the case of read data "0".

As illustrated in FIG. 3, in a DRAM device that uses a GND precharge scheme, if a read data is "1", a voltage of a bit line BL increases by dV from the precharged ground voltage GND and a complementary bit line BLB remains at the ground voltage GND. After a sense amplifier amplifies the voltage levels, the bit line BL is at the power supply voltage VDD and the complementary bit line BLB is at the ground voltage GND.

As illustrated in FIG. 4, in a DRAM device that uses GND precharge scheme, if a read data is "0", both a bit line BL and a complementary bit line BLB remain at the precharged ground voltage GND. After a sense amplifier amplifies the voltage levels, the complementary bit line BLB is at the power supply voltage VDD and the bit line BL is at the ground voltage GND. In this case, when the read data is "0", the sense amplifier utilizes the difference between the power of the ground voltage of the bit line BL and the power of the ground voltage of the complementary bit line BLB to detect the voltage levels of the bit line BL and the complementary bit line BLB.

However, in a DRAM device that uses GND precharge scheme, the voltage difference between the bit line BL and the complementary bit line BLB is not sufficient to be detected in case that a read data is "0," and thus a detection error and ultimately a read error may occur.

Figure 5:
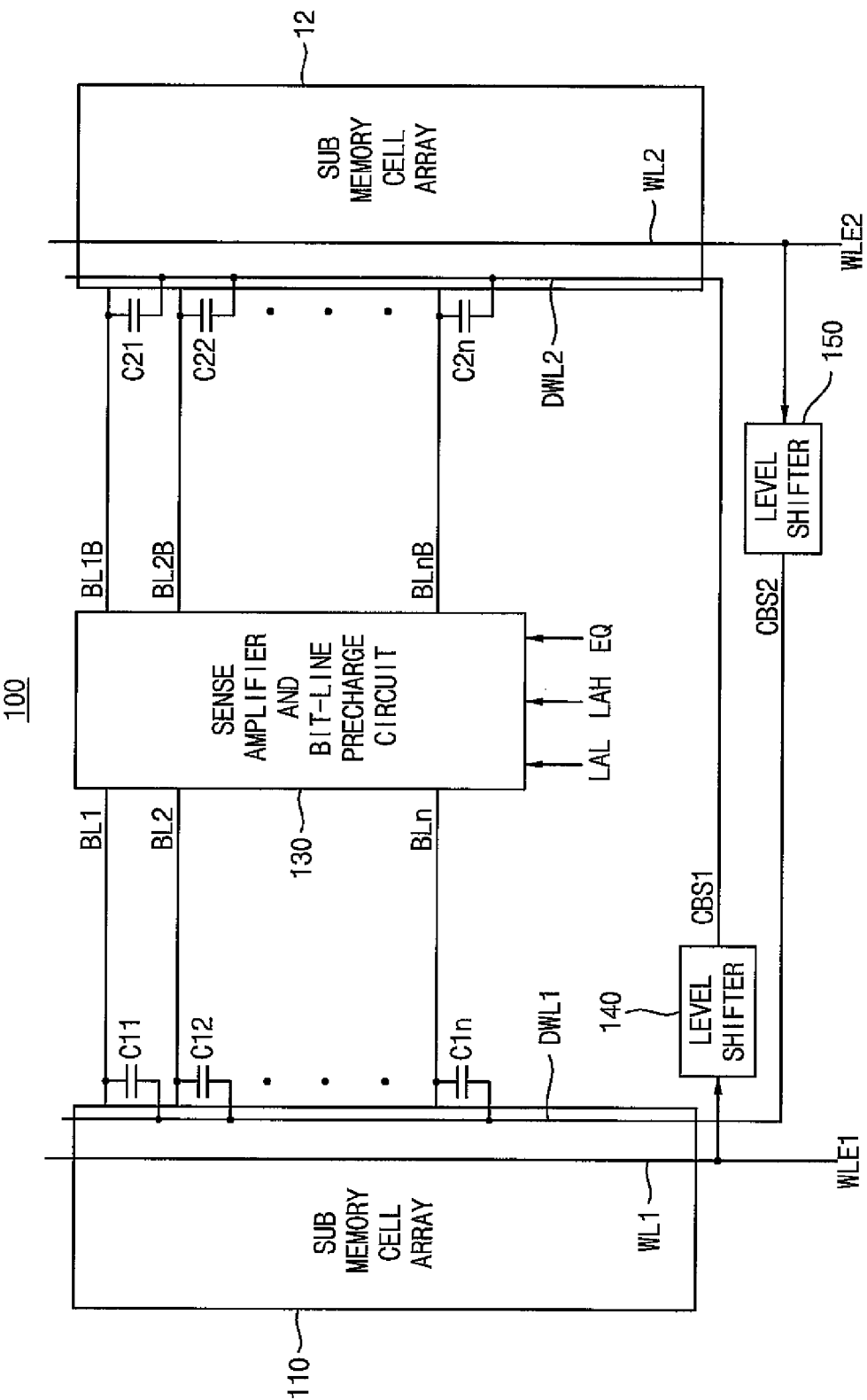
FIG. 5 is a circuit diagram illustrating a memory cell array according to a first example embodiment.

FIG. 5 is a circuit diagram illustrating a memory cell array according to a first example embodiment.

Referring to FIG. 5, the memory cell array 100 includes a first sub memory cell array 110, a second sub memory cell array 120, a sense-amplifier/precharge circuit 130, first boosting capacitors C21~C2n, second boosting capacitors C11~C1n, a first level shifter 140 and a second level shifter 150.

A first word line WL1 in the first sub memory cell array 110 is activated in response to a first word line enable signal WLE1, and a second word line WL2 in the second sub memory cell array 120 is activated in response to a second word line enable signal WLE2.

The sense-amplifier/precharge circuit 130 is connected to the first sub memory cell array 110 through first bit lines BL1~BLn and connected to the second sub memory cell array 120 through second bit lines BL1B~BLnB. The sense-amplifier/precharge circuit 130 precharges the first bit lines BL1~BLn and the second bit lines BL1B~BLnB, and amplifies data provided from the first sub memory cell array 110 and the second sub memory cell array 120.

The first level shifter 140 generates a first boosting voltage signal CBS1 in response to the first word line enable signal WLE1. The second level shifter 150 generates a second boosting voltage signal CBS2 in response to the second word line enable signal WLE2. The first level shifter 140 provides the first boosting voltage signal CBS1 to a first dummy word line DWL2 and the second level shifter 150 provides the second boosting voltage signal CBS2 to a second dummy word line DWL1. If a precharge voltage of the bit lines is the ground voltage GND, each of the activated voltage of the first boosting voltage signal CBS1 and the second boosting voltage signal CBS2 may be the same as or smaller than each of the activated voltage of the first word line enable signal WLE1 and the second word line enable signal WLE2, respectively. On the contrary, if a precharge voltage of the bit lines is the power supply voltage VDD, each of the activated voltage of the first boosting voltage signal CBS1 and the second boosting voltage signal CBS2 may be negative.

The first boosting capacitors C21~C2n are connected between the first dummy word line DWL2 and each of the second bit lines BL1B~BLnB and boost the voltage of the second bit lines in response to the first boosting voltage signal CBS1. The second boosting capacitors C11~C1n are connected between the second dummy word line DWL1 and each of the first bit lines BL1~BLn and boost the voltage of the first bit lines in response to the second boosting voltage signal CBS2.

Figure 6:
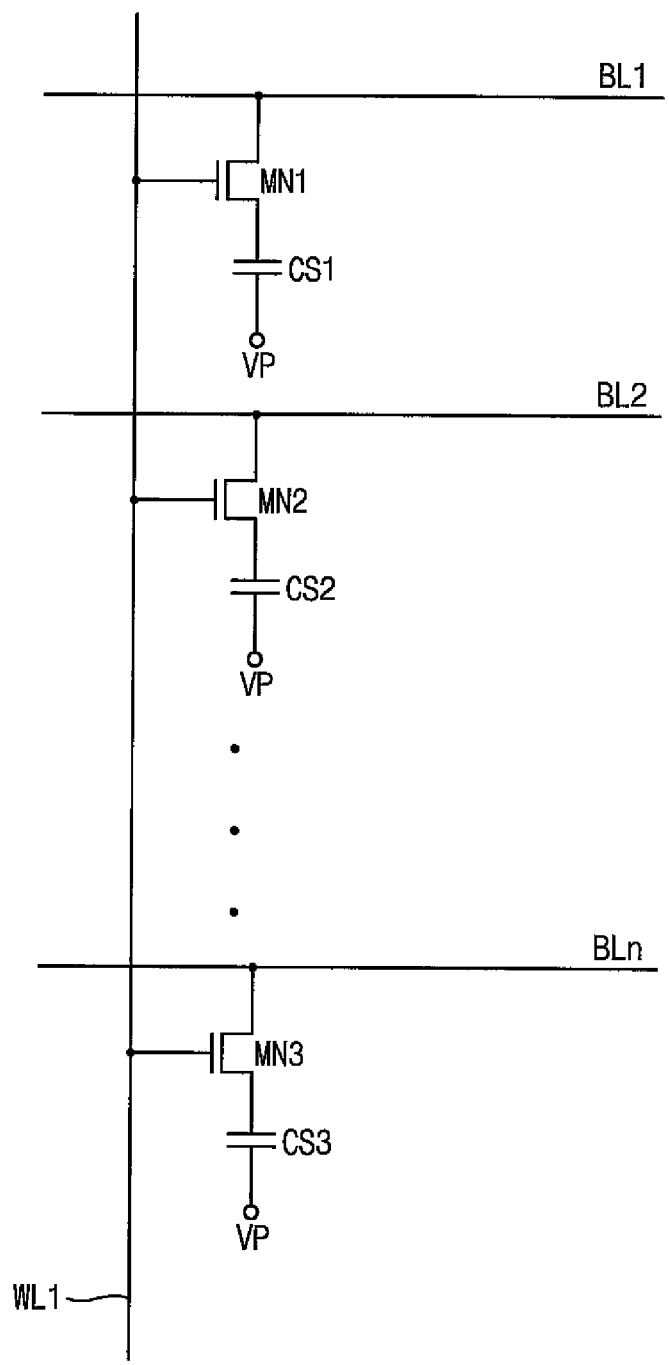
FIG. 6 is a circuit diagram illustrating a first sub memory cell array in the memory cell array of FIG. 5.
Figure 7:
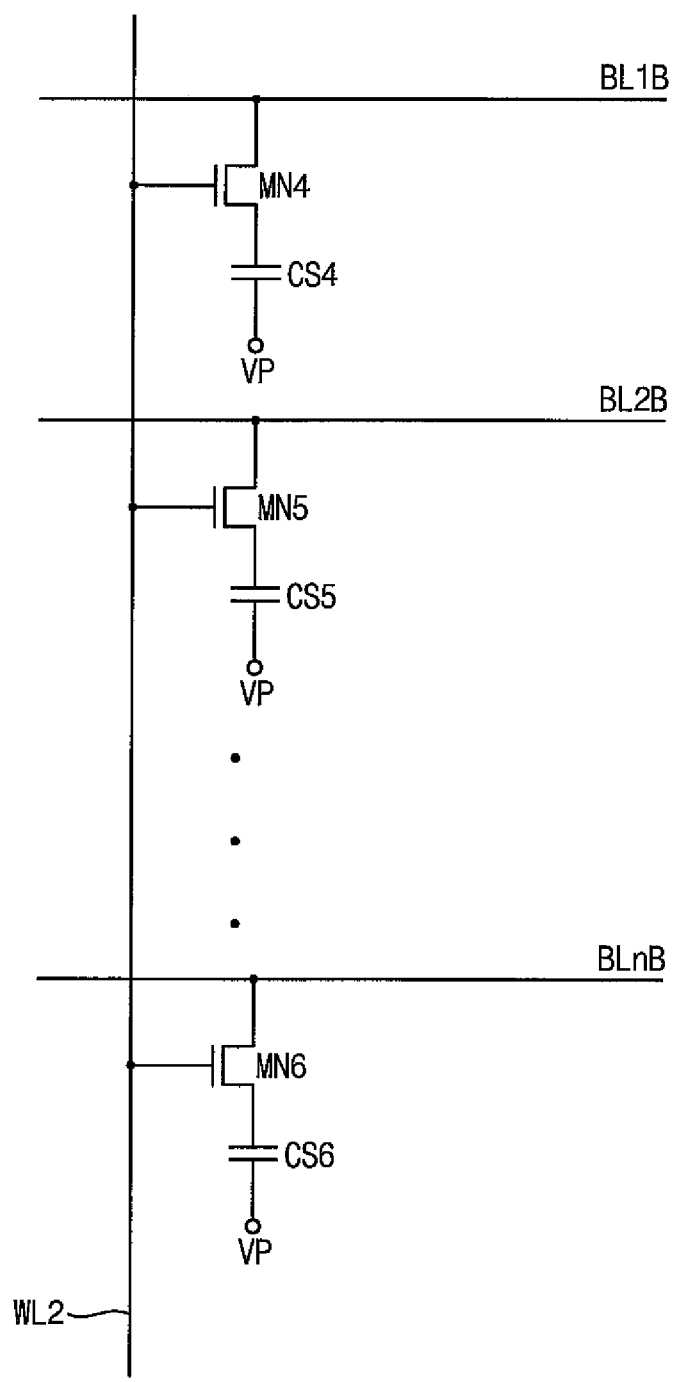
FIG. 7 is a circuit diagram illustrating a second sub memory cell array in the memory cell array of FIG. 5.

FIG. 6 is a circuit diagram illustrating a first sub memory cell array 110 in the memory cell array of FIG. 5, and FIG. 7 is a circuit diagram illustrating a second sub memory cell array 120 in the memory cell array of FIG. 5.

Referring to FIGS. 6 and 7, each of the first sub memory cell array 110 and the second sub memory cell array 120 includes a plurality of memory cells. For example, each memory cell may include a single transistor (MN1~MN3) and a single capacitor (CS1~CS3), at the intersection of the bit lines and the word line. In the figures, VP denotes a reference voltage.

Figure 8:
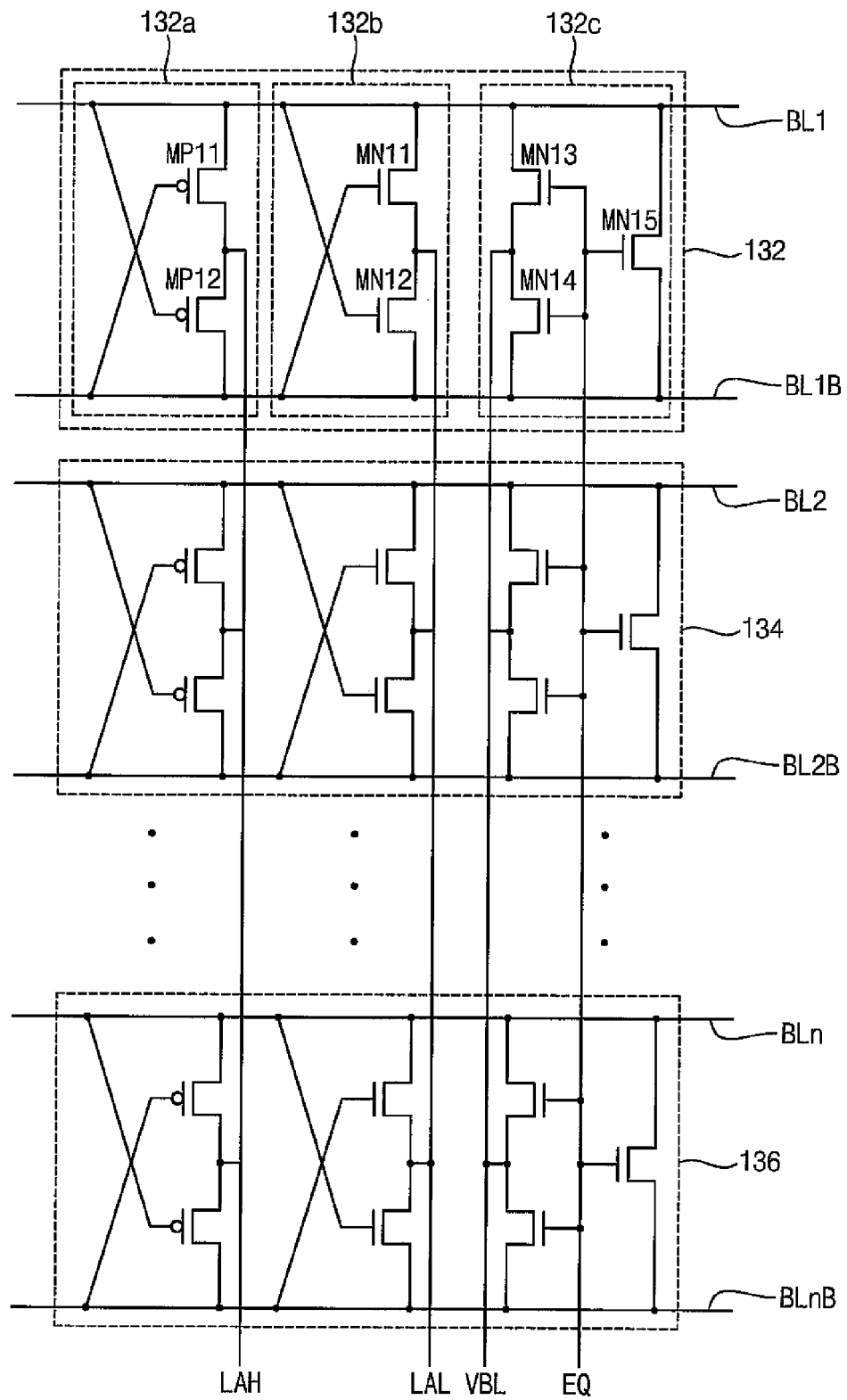
FIG. 8 is a circuit diagram illustrating a sense-amplifier/precharge circuit in the memory cell array of FIG. 5.

FIG. 8 is a circuit diagram illustrating a sense-amplifier/precharge circuit 130 in the memory cell array of FIG. 5.

Referring to FIG. 8, the sense-amplifier/precharge circuit 130 includes a plurality of sense-amplifier/precharge units 132, 134 and 136 respectively connected between a pair of the bit lines. For example, the first sense-amplifier/precharge unit 132 includes a P-type sense-amplifier 132a, an N-type sense-amplifier 132b and a precharge circuit 132c.

The P-type sense-amplifier 132a includes a first PMOS transistor MP11 and a second PMOS transistor MP12 connected in series between a pair of first bit lines BL1 and BL1B. The first PMOS transistor MP11 includes a gate connected to a first complementary bit line BL1B and a source connected to the first bit line BL1. The second PMOS transistor MP12 includes a gate connected to the first bit line BL1, a source connected to a drain of the first PMOS transistor MP11, and a drain connected to the first complementary bit line BL1B.

The N-type sense-amplifier 132b includes a first NMOS transistor MN11 and a second NMOS transistor MN12 connected in series between the pair of first bit lines BL1 and BL1B. The first NMOS transistor MN11 includes a gate connected to the first complementary bit line BL1B and a drain connected to the first bit line BL1. The second NMOS transistor MN12 includes a gate connected to the first bit line BL1, a drain connected to a source of the first NMOS transistor MN11, and a source connected to the first complementary bit line BL1B.

A high power supply voltage LAH is applied to the drain of the first PMOS transistor MP11 and a low power supply voltage LAL is applied to the source of the first NMOS transistor MN11. The high power supply voltage LAH may be the power supply voltage VDD and the low power supply voltage LAL may be the ground voltage GND.

The precharge circuit 132c includes a third NMOS transistor MN13, a forth NMOS transistor MN14 and a fifth NMOS transistor MN15 connected between the pair of first bit lines BL1, BL1B. The drain of the third NMOS transistor MN13 is connected to the first bit line BL1. The forth NMOS transistor MN14 includes a source connected to the first complementary bit line BL1B, a drain connected to the source of the third NMOS transistor MN13 and a gate connected to the gate of the third NMOS transistor MN13. The fifth NMOS transistor MN15 includes a drain connected to the first bit line BL1, a source connected to the first complementary bit line BL1B and a gate connected to the gate of the third NMOS transistor MN13. A precharge voltage VBL is applied to the source of the third NMOS transistor MN13 and a precharge control signal EQ is applied to the junction of the third NMOS transistor MN13, the forth NMOS transistor MN14 and the fifth NMOS transistor MN15.

The second sense-amplifier/precharge unit 134 and the third sense-amplifier/precharge unit 136 have substantially the same configuration as that of the first sense-amplifier/precharge unit 132.

If a precharge voltage of the bit lines is the ground voltage GND, the P-type sense-amplifier 132a primarily amplifies the voltage difference between the bit lines. On the contrary, if a precharge voltage of the bit lines is the power supply voltage VDD, the N-type sense-amplifier 132b primarily amplifies the voltage difference between the bit lines.

Figure 9:
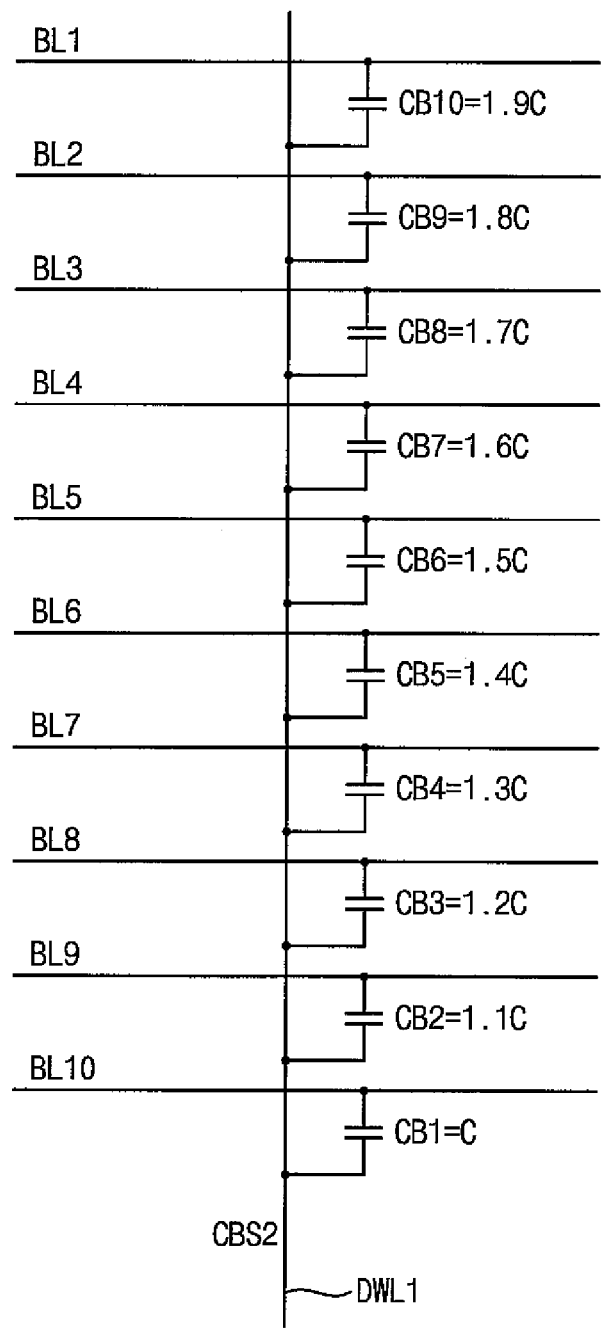
FIG. 9 is a circuit diagram illustrating an arrangement of boosting capacitors connected between the bit lines and the second dummy word line in FIG. 5.

FIG. 9 is a circuit diagram illustrating an arrangement of the boosting capacitors that are connected between the bit lines and the second dummy word line DWL1 in FIG. 5. In particular, FIG. 9 illustrates an embodiment of an arrangement of the boosting capacitors in the case where the first sub memory cell array 110 includes 10 bit lines.

Referring to FIG. 9, a first boosting capacitor CB10 is connected between a first bit line BL1 and the second dummy word line DWL1, and a second boosting capacitor CB9 is connected between a second bit line BL2 and the second dummy word line DWL1. Similarly, a ninth boosting capacitor CB2 is connected between a ninth bit line BL9 and the second dummy word line DWL1, and a tenth boosting capacitor CB1 is connected between a tenth bit line BL10 and the second dummy word line DWL1. The second boosting voltage signal CBS2 is applied through the second dummy word line DWL1.

As illustrated in FIG. 9, each of the boosting capacitors CB1~CB10 may have different capacitances according to the distance from the starting point of the second dummy word line DWL1, namely from the second level shifter 150 of FIG. 5. For example, as illustrated in FIG. 9, when the capacitance of the tenth boosting capacitor CB1 located nearest to the second level shifter 150 of FIG. 5 is C, the capacitance of the ninth boosting capacitor CB2 may be 1.1 C, the capacitance of the eighth boosting capacitor CB3 may be 1.2 C, the capacitance of the seventh boosting capacitor CB4 may be 1.3 C, the capacitance of the sixth boosting capacitor CB5 may be 1.4 C, the capacitance of the fifth boosting capacitor CB6 may be 1.5 C, the capacitance of the fourth boosting capacitor CB7 may be 1.6 C, the capacitance of the third boosting capacitor CB8 may be 1.7 C, the capacitance of the second boosting capacitor CB9 may be 1.8 C, and the capacitance of the first boosting capacitor CB10 may be 1.9 C.

In this way, the capacitances of the boosting capacitors connected to the bit lines BL1~BL10 are different from each other so that the bit lines BL1~BL10 may be boosted up to substantially the same voltage level regardless of the voltage drop caused by resistance of the second dummy word line DWL1 according to the location of the boosting capacitors.

Figure 10:
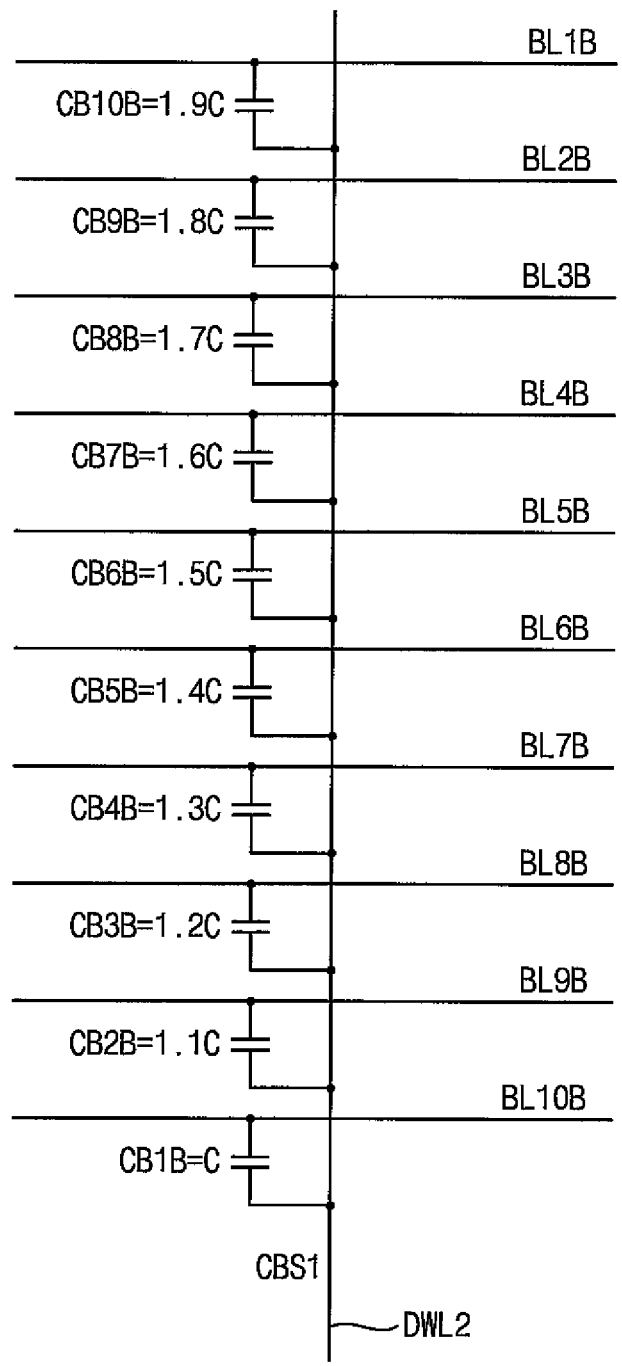
FIG. 10 is a circuit diagram illustrating an arrangement of boosting capacitors connected between the complementary bit lines and the first dummy word line in FIG. 5.

FIG. 10 is a circuit diagram illustrating an arrangement of the boosting capacitors that are connected between the complementary bit lines and the first dummy word line DWL2 in FIG. 5. In particular, FIG. 10 illustrates an embodiment of an arrangement of the boosting capacitors in the case where the second sub memory cell array 120 includes 10 complementary bit lines As illustrated in FIG. 10, each of the boosting capacitors CB1B~CB10B may have different capacitances according to the distance from the starting point of the first dummy word line DWL2, namely from the first level shifter 140 of FIG. 5. For example, as illustrated in FIG. 10, when the capacitance of the twentieth boosting capacitor CB1B located nearest to the first level shifter 140 of FIG. 5 is C, the capacitance of the nineteenth boosting capacitor CB2B may be 1.1 C, the capacitance of the eighteenth boosting capacitor CB3B may be 1.2 C, the capacitance of the seventeenth boosting capacitor CB4B may be 1.3 C, the capacitance of the sixteenth boosting capacitor CB5B may be 1.4 C, the capacitance of the fifteenth boosting capacitor CB6B may be 1.5 C, the capacitance of the fourteenth boosting capacitor CB7B may be 1.6 C, the capacitance of the thirteenth boosting capacitor CB8B may be 1.7 C, the capacitance of the twelfth boosting capacitor CB9B may be 1.8 C, and the capacitance of the eleventh boosting capacitor CB10B may be 1.9 C.

In this way, the capacitances of the boosting capacitors connected to the complementary bit lines BL1B~BL10B are different from each other so that the complementary bit lines BL1B~BL10B may be boosted up to substantially the same voltage level regardless of the voltage drop caused by resistance of the first dummy word line DWL2 according to the location of the boosting capacitors.

Figure 11:
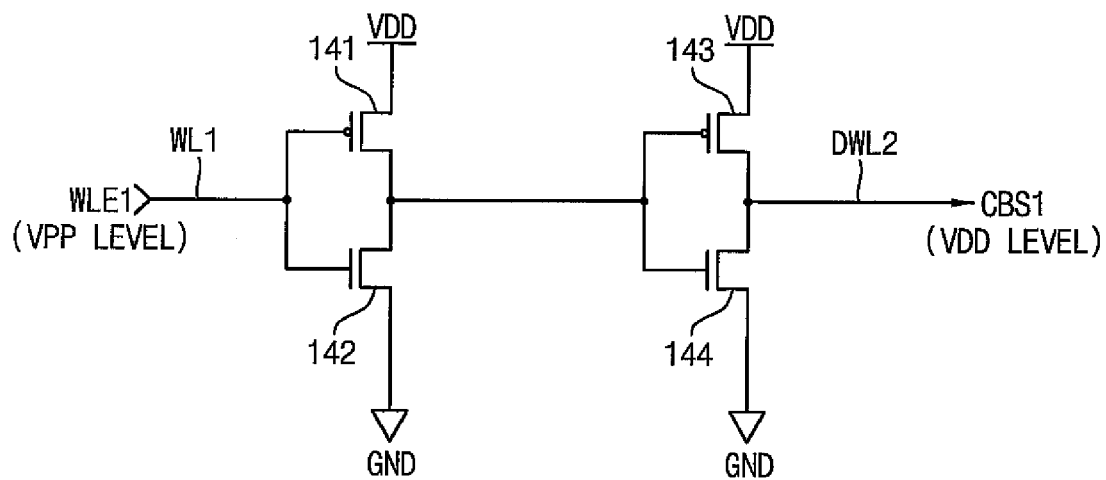
FIG. 11 is a circuit diagram illustrating an example of a level shifter in the memory cell array of FIG. 5.

FIG. 11 is a circuit diagram illustrating an example of a level shifter in the memory cell array of FIG. 5. The first level shifter illustrated in FIG. 11 has a two-stage inverter structure.

The first level shifter 140 generates the first boosting voltage signal CBS1 by reducing the activated voltage level of the first word line enable signal WLE1. The activated voltage of the first word line enable signal WLE1 is a boost voltage VPP that is higher than the power supply voltage VDD, and the voltage of the first boosting voltage signal CBS1 is the power supply voltage VDD.

The first level shifter 140 includes a first inverter including a third PMOS transistor 141 and a sixth NMOS transistor 142, and a second inverter including a fourth PMOS transistor 143 and a seventh NMOS transistor 144. If the first word line enable signal WLE1 is in the logic "high" state with the boost voltage VPP, then the first boosting voltage signal CBS1 is in the logic "high" state with the power supply voltage VDD. If the first word line enable signal WLE1 is in the logic "low" state with the ground voltage GND, then the first boosting voltage signal CBS1 is in the logic "low" state with the ground voltage GND.

In order to make the phase of the first boosting voltage signal CBS1 and the phase of the first word line enable signal the same, the two inverters illustrated in FIG. 11 may be connected in series in the level shifter 140.

The second level shifter 150 in the memory cell array of FIG. 5 may have the same configuration as that of the level shifter illustrated in FIG. 11.

Figure 12:
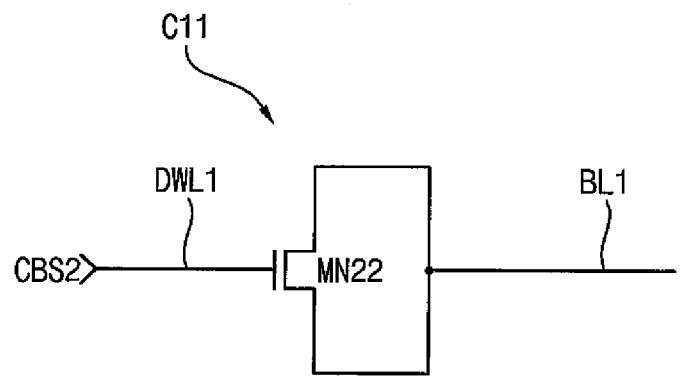
FIG. 12 is a circuit diagram illustrating an example of the boosting capacitor connected between the bit lines and the second dummy word line in FIG. 5.

FIG. 12 is a circuit diagram illustrating an example of the boosting capacitor C11 connected between the bit lines and the second dummy word line DWL1 in FIG. 5. Referring to FIG. 12, the boosting capacitor C11 includes a first node, which is a gate of a eighth NMOS transistor MN22, and a second node, which is the junction of a source and a drain of the eighth NMOS transistor MN22. The first node of the boosting capacitor C11 is connected to the second dummy word line DWL1, and the second node of the boosting capacitor C11 is connected to the first bit line BL1.

Figure 13:
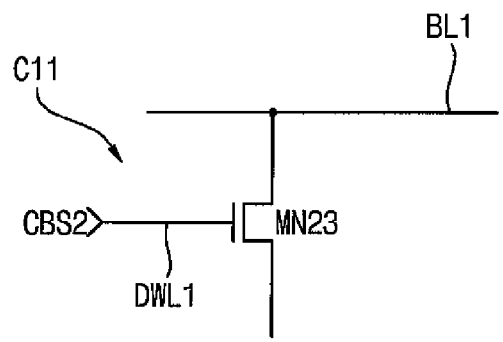
FIG. 13 is a circuit diagram illustrating another example of the boosting capacitor connected between the bit lines and the second dummy word line in FIG. 5.

FIG. 13 is a circuit diagram illustrating another example of the boosting capacitor C11 connected between the bit lines and the second dummy word line DWL1 in FIG. 5. Referring to FIG. 13, the boosting capacitor C11 includes a first node, which is a gate of a ninth NMOS transistor MN23, and a second node, which is a drain of the ninth NMOS transistor MN23. A source of the ninth NMOS transistor MN23 is floated. The first node of the boosting capacitor C11 is connected to the second dummy word line DWL1, and the second node of the boosting capacitor C11 is connected to the first bit line BL1.

The capacitance of the boosting capacitor C11 illustrated in FIGS. 12 and 13 can be set to a desirable value by adjusting the size of MOS transistor W/L. The boosting capacitor C11 illustrated in FIG. 12 uses a gate capacitance of the MOS transistor MN22 and the boosting capacitor C11 illustrated in FIG. 13 uses an overlap capacitance of the MOS transistor MN23.

All the boosting capacitors (C11~C1$n$ and C21~C2$n$) illustrated in FIG. 5 may have the same configuration as the capacitor illustrated in FIG. 12 or FIG. 13.

Figure 14:
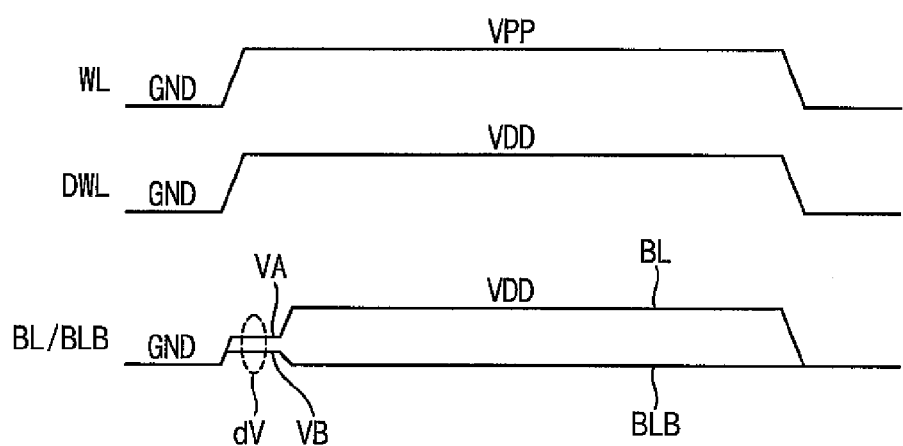
FIGS. 14 and 15 are diagrams illustrating voltage waveforms of a bit line pair in a DRAM device that includes the memory cell array of FIG. 5.
Figure 15:
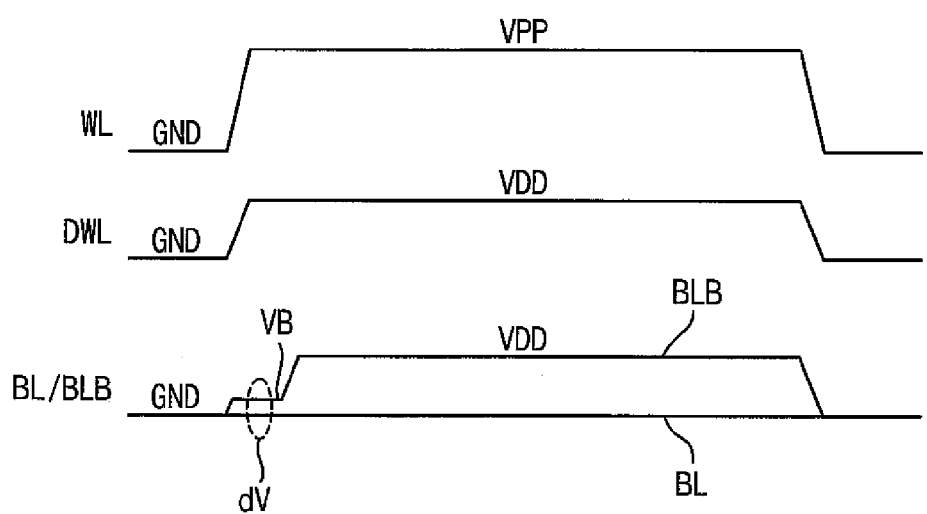

FIG. 14 is a diagram illustrating a voltage waveform of a bit line pair in the case of read data "1", and FIG. 15 is a diagram illustrating a voltage waveform of a bit line pair in the case of read data "0" in a DRAM device that includes the memory cell array of FIG. 5. In a reading mode, the activated word line WL is in a level of the boost voltage VPP and the activated dummy word line DWL is in a level of the power supply voltage VDD.

Hereinafter, the operation of a DRAM device having the memory cell array 100 according to an example embodiment will be described with reference to FIGS. 5 to 14.

When data of logic "1" in a memory cell is read, the operation of the memory cell array 100 of FIG. 5 is as follows.

The sense-amplifier/precharge circuit 130 precharges the first bit lines BL1~BLn and the second bit lines BL1B~BLnB to the ground voltage GND before the word line is activated. If the first word line enable signal WLE1 is activated, the first word line WL1 is activated and each of the memory cells connected to the first word line WL1 shares charges with a corresponding bit line among the first bit lines BL1~BLn. Therefore, each of the first bit lines BL1~BLn has a higher voltage than the precharge voltage since data of logic "1" in a memory cell is coupled to the bit line.

The first level shifter 140 generates the first boosting voltage signal CBS1 in response to the first word line enable signal WLE1. The first boosting capacitors C21~C2$n$ boost the second bit lines BL1B~BLnB to a designated voltage VB in response to the first boosting voltage signal CBS1.

When the first word line enable signal WLE1 is activated, the second word line enable signal WLE2 is deactivated. Therefore, the second boosting capacitors C11~C1$n$ are deactivated and the first bit lines BL1~BLn are not boosted.

The sense-amplifier/precharge circuit detects the voltage difference between VA and VB, and amplifies the first bit lines BL1~BLn to the power supply voltage VDD, whereas the second bit lines BL1B~BLnB are pulled down to the ground voltage GND. Thereafter, an amplified voltage in a bit line selected by a column select signal among the first bit lines BL1~BLn is provided externally from a DRAM device through an I/O path (not illustrated in FIG. 5) to an external device such as a memory controller.

Referring to FIG. 14, when the memory cell having data "1" is selected by the activated word line, the voltage of the bit line BL increases from the ground voltage GND, which is a precharge voltage, to a first voltage VA and then is amplified to the power supply voltage VDD by the sense-amplifier. The voltage of the complementary bit line BLB increases from the ground voltage GND, which is a precharge voltage, to a second voltage VB and then is pulled down to the ground voltage GND by the sense-amplifier.

The first voltage VA is a bit line voltage after the charges stored in a cell capacitor of a memory cell and the charges in the bit lines are shared, when data in memory cells connected to the bit lines are read. The second voltage VB is a voltage generated by the first boosting capacitors C21~C2n, when data in memory cells connected to the bit lines are read. The first boosting capacitors C21~C2n are activated by the first boosting voltage signal CBS1 applied through the first dummy word line DWL2. The first boosting voltage signal CBS1 is a signal having a reduced voltage level with respect to the first word line enable signal WLE1 by the first level shifter 140.

The difference between the first voltage VA and the second voltage VB is a voltage dV between a pair of bit lines to be sensed, and the voltage dV may have a suitable value to be stably sensed by the sense-amplifier if the first boosting capacitors C21~C2n are designed to have relatively small capacitances.

Referring to FIG. 15, when the memory cell having data "0" is selected by the activated word line, the voltage of the bit line BL remains at the ground voltage GND, that is a precharge voltage. The voltage of the complementary bit line BLB increases from the ground voltage GND, which is a precharge voltage, to a second voltage VB and then is amplified to the power supply voltage VDD by the sense-amplifier.

The second voltage VB is a voltage generated by the first boosting capacitors C21~C2n, when data in memory cells connected to the bit lines are read. The first boosting capacitors C21~C2n are activated by the first boosting voltage signal CBS1 applied through the first dummy word line DWL2.

As described above, the first boosting voltage signal CBS1 may be a signal having a reduced voltage level with respect to the first word line enable signal WLE1 by the first level shifter 140. The difference between the second voltage VB and the ground voltage GND is a voltage dV between a pair of bit lines to be sensed. The voltage dV may have a suitable value to be stably sensed by the sense-amplifier if the first boosting capacitors C21~C2n are designed to have appropriate capacitances.

FIGS. 14 and 15 illustrate voltage waveforms of a bit line connected to a memory cell, that is a true cell, and a complementary bit line connected to a complementary cell, when data in the true cell is read. Voltage waveforms of a bit line and a complementary bit line, when data in the complementary cell connected to the complimentary bit line is read, are opposite to the voltage waveforms of FIGS. 14 and 15.

Figure 16:
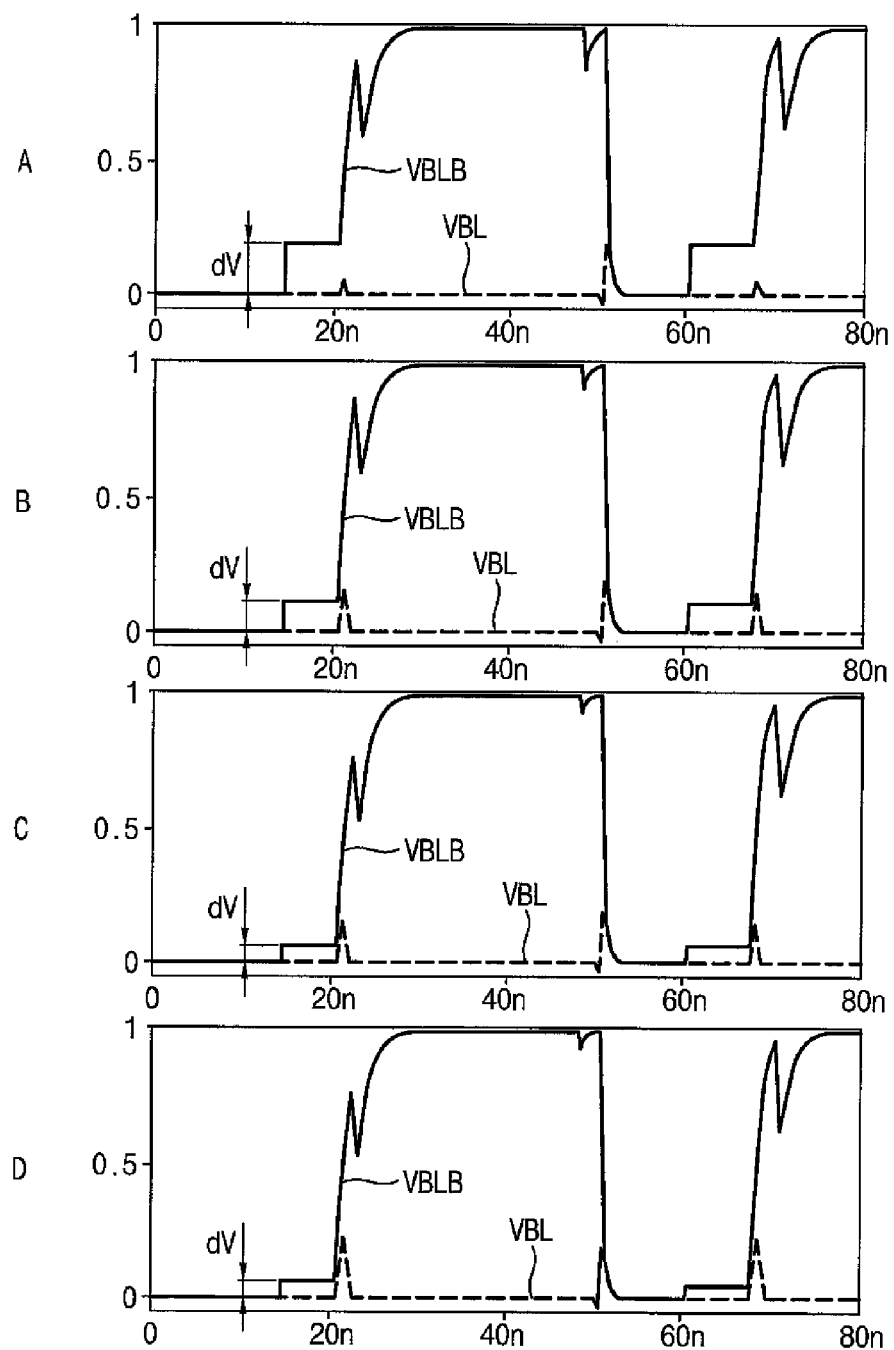
FIGS. 16, 17 and 18 are simulation diagrams illustrating an operation of a DRAM device that includes the memory cell array of FIG. 5.

FIG. 16 is a simulation diagram illustrating an operation of a DRAM device that includes the memory cell array of FIG. 5 in the case of read data "0". In FIG. 16, VBL is a voltage of the bit line BL and VBLB is a voltage of the complementary bit line BLB. Precharge voltage corresponds to the ground voltage GND and the threshold voltage offset of the PMOS transistors MP11 and MP12 of the P-type sense-amplifier 132A of FIG. 8 is about 50 mV.

FIG. 16A illustrates a case where the capacitances of the boosting capacitors (C11~C1n and C21~C2n) are ⅕ of the capacitance of the cell capacitor in the memory cell. FIG. 16B illustrates a case where the capacitances of the boosting capacitors (C11~C1n and C21~C2n) are 1/10 of the capacitance of the cell capacitor in the memory cell. FIG. 16C illustrates a case where the capacitances of the boosting capacitors (C11~C1n and C21~C2n) are 1/15 of the capacitance of the cell capacitor in the memory cell. FIG. 16D illustrates a case where the capacitances of the boosting capacitors (C11~C1n and C21~C2n) are 1/20 of the capacitance of the cell capacitor in the memory cell.

As illustrated in FIG. 16, the voltage difference dV between a pair of the bit lines to be sensed by the sense-amplifier decreases as the capacitances of the boosting capacitors (C11~C1n and C21~C2n) decrease. After the sense-amplifier amplifies voltages, the voltage of the bit line VBL is the ground voltage GND and the voltage of the complementary bit line VBLB is the power supply voltage VDD.

Figure 17:
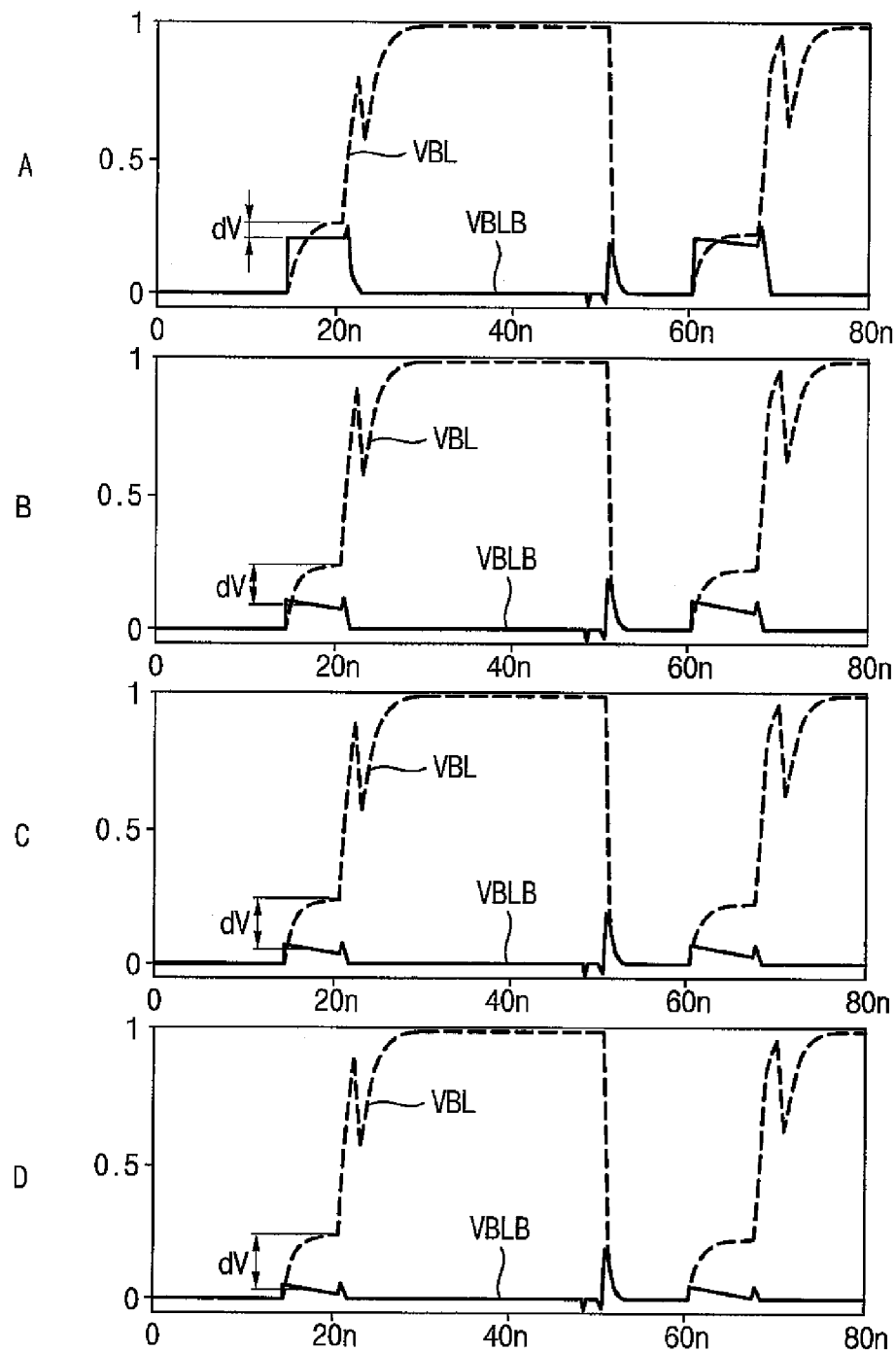

FIG. 17 is a simulation diagram illustrating an operation of a DRAM device that includes the memory cell array of FIG. 5 in the case of read data "1". In FIG. 17, VBL is a voltage of the bit line BL and VBLB is a voltage of the complementary bit line BLB. The precharge voltage corresponds to the ground voltage GND and the threshold voltage offset of the PMOS transistors MP11 and MP12 of the P-type sense-amplifier 132A of FIG. 8 is about 50 mV.

FIG. 17A illustrates a case where the capacitances of the boosting capacitors (C11~C1n and C21~C2n) are ⅕ of the capacitance of the cell capacitor in the memory cell. FIG. 17B illustrates a case where the capacitances of the boosting capacitors (C11~C1n and C21~C2n) are 1/10 of the capacitance of the cell capacitor in the memory cell. FIG. 17C illustrates a case where the capacitances of the boosting capacitors (C11~C1n and C21~C2n) are 1/15 of the capacitance of the cell capacitor in the memory cell. FIG. 17D illustrates a case where the capacitances of the boosting capacitors (C11~C1n and C21~C2n) are 1/20 of the capacitance of the cell capacitor in the memory cell.

As illustrated in FIG. 17, the voltage difference dV between a pair of the bit lines to be sensed by the sense-amplifier increases as the capacitances of the boosting capacitors (C11~C1n and C21~C2n) decrease. After the sense-amplifier amplifies the sensed voltages, the voltage of the bit line VBL is the power supply voltage VDD and the voltage of the complementary bit line VBLB is the ground voltage GND.

Referring to FIG. 16 and FIG. 17, when data "0" is read, the voltage difference dV between a pair of the bit lines to be sensed decreases as the capacitances of the boosting capacitors (C11~C1n and C21~C2n) decrease, and when data "1" is read, the voltage difference dV between a pair of the bit lines to be sensed increases as the capacitances of the boosting capacitors (C11~C1n and C21~C2n) decrease. Therefore, when data "0" and "1" are read, the boosting capacitors (C11~C1n and C21~C2n) should be designed to ensure that the voltage difference dV between a pair of the bit lines can be stably sensed by the sense-amplifier.

Figure 18:
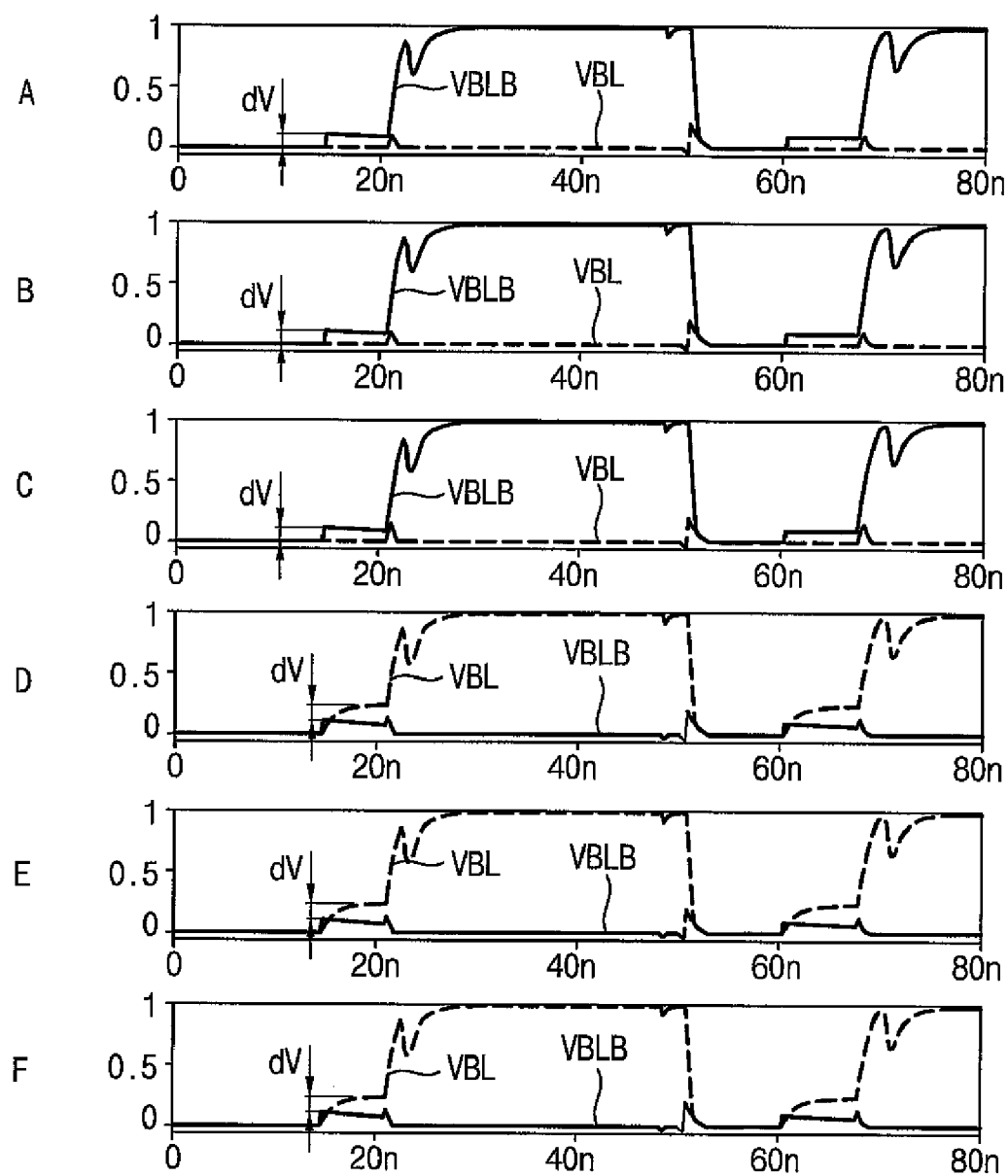

FIG. 18 contains simulation diagrams illustrating an operation of a DRAM device that includes the memory cell array of FIG. 5, when offset threshold voltages of a transistor in the P-type sense-amplifier. All of FIGS. 18A, 18B and 18C are simulation diagrams in case where the capacitances of the boosting capacitors (C11~C1n and C21~C2n) are 1/10 of the capacitance of the cell capacitor in the memory cell and read data is logic "0". All of FIGS. 18D, 18E and 18F are simulation diagrams in case where the capacitances of the boosting capacitors (C11~C1n and C21-C2n) are 1/10 of the capacitance of the cell capacitor in the memory cell and read data is logic "1".

FIGS. 18A and 18D are simulation diagrams in case where the threshold voltage offset of the PMOS transistors MP11 and MP12 of the P-type sense-amplifier 132A of FIG. 8 is about 0V. FIGS. 18B and 18E are simulation diagrams in case that the threshold voltage offset of the PMOS transistors MP11 and MP12 is about 25 mV FIGS. 18C and 18F are simulation diagrams in case that the threshold voltage offset of the PMOS transistors MP11 and MP12 is about 50 mV.

As illustrated in FIGS. 18A to 18F, even in case that the threshold voltage offset of the PMOS transistors MP11 and MP12 is about 50 mV, data in the memory cell are sensed and amplified exactly.

Figure 19:
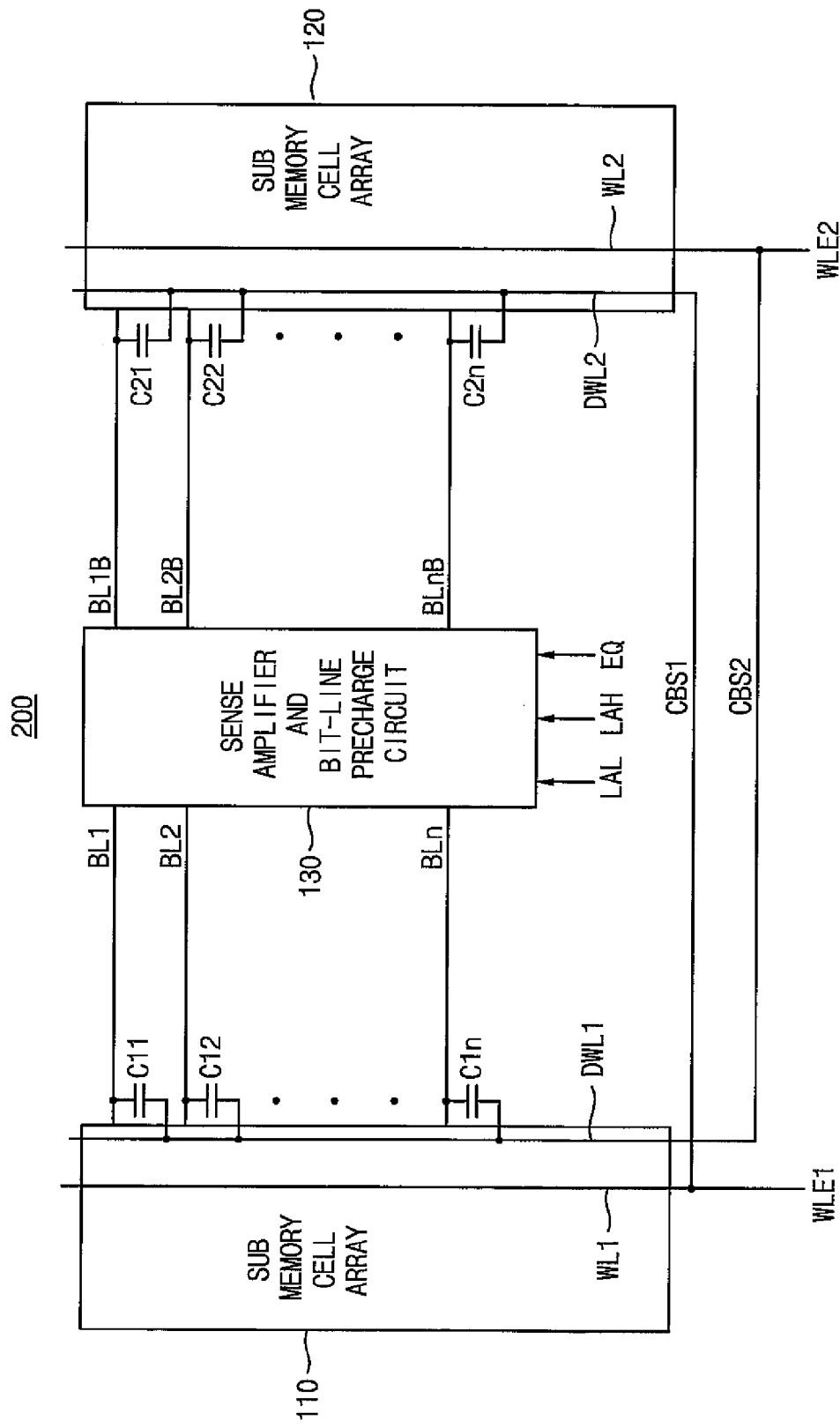
FIG. 19 is a circuit diagram illustrating a memory cell array according to a second example embodiment.

FIG. 19 is a circuit diagram illustrating a memory cell array according to a second example embodiment.

Referring to FIG. 19, the memory cell array 200 includes the first sub memory cell array 110, the second sub memory cell array 120, the sense-amplifier/precharge circuit 130, the first boosting capacitors C21~C2n and the second boosting capacitors C11~C1n.

The memory cell array 200 illustrated in FIG. 19 does not include the level shifters 140 and 150 of FIG. 5. The first boosting voltage signal CBS1, provided to the first boosting capacitors C21~C2n connected to the second bit lines BL1B~BLnB, has the same voltage level as the first word line enable signal WLE1. Also, the second boosting voltage signal CBS2, provided to the second boosting capacitors C11~C1n connected to the first bit lines BL1~BLn, has the same voltage level as the second word line enable signal WLE2.

Therefore, the first boosting capacitors C21~C2n and the second boosting capacitors C11~C1n in the memory cell array 200 illustrated in FIG. 19 are designed to have smaller capacitances than the first boosting capacitors C21~C2n and the second boosting capacitors C11~C1n in the memory cell array 100 illustrated in FIG. 5.

To avoid redundancy, the description of the operation of the memory cell array 200 illustrated in FIG. 19 will be omitted because it is similar to the operation of the memory cell array 100 according to the first example embodiment illustrated in FIG. 5.

FIG. 20 is a block diagram illustrating a DRAM device 1000 that includes a memory cell array according to an example embodiment.

Referring to FIG. 20, the DRAM device includes a memory cell array 1100, a selecting circuit 1200, a local sense-amplifier 1300, an I/O sense-amplifier 1400 and an I/O buffer 1500.

The memory cell array 1100 has a configuration corresponding to the memory cell array of the example embodiments illustrated in FIG. 5 or FIG. 19. The selecting circuit 1200 selectively provides output signals of the memory cell array 1100 to a pair of local I/O lines LIO and LIOB in response to the column select signal CSL. The local sense-amplifier 1300 amplifies the signals of the pair of local I/O lines LIO and LIOB and provides the signals to a pair of global I/O lines GIO and GIOB. The I/O sense-amplifier 1400 amplifies the signals of the pair of global I/O lines GIO and GIOB. The I/O buffer 1500 buffers the output signals provided by the I/O sense-amplifier and generate output data DOUT. The I/O buffer 1500 also buffers an input data DIN and provides the data to the I/O sense-amplifier 1400.

In the above, in a DRAM device that uses a GND precharge scheme, the method for detecting data by adjusting voltage levels of the bit lines, connected to memory cells, which are not read among pairs of the bit lines by using the boosting capacitors is described. In some embodiments, the present invention can be applied to a DRAM device that uses full-VDD precharge scheme.

In the case of a DRAM device that uses a full-VDD precharge scheme, the boosting voltage signal applied to the dummy word line is negative and the voltage difference between the bit lines are mainly amplified by the N-type sense-amplifier 132B of FIG. 8.

Accordingly, in a semiconductor memory device adopting full-VDD precharge scheme or GND precharge scheme, the memory cell array can exactly detect data "0" by adjusting voltage levels of the bit lines, connected to memory cells, which are not read among pairs of the bit lines by using boosting capacitors. The boosting capacitors are embodied with MOS transistors. Further, each bit line can be boosted up to a constant voltage by selecting the capacitance of the capacitors connected to each bit line differently according to the distance from a node to which a voltage signal is applied.

In the above, reading data in a memory cell array of a DRAM device is described, but the present invention can also be applied to reading data in a memory cell array of a general semiconductor memory device.

The foregoing is illustrative of the present invention and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A memory cell array, comprising:
   a first sub memory cell array that is activated in response to a first word line enable signal;
   a second sub memory cell array that is activated in response to a second word line enable signal;
   a sense-amplifier/precharge circuit connected to the first sub memory cell array through first bit lines and connected to the second sub memory cell array through second bit lines, the sense-amplifier/precharge circuit configured to precharge the first bit lines and the second bit lines and to amplify data provided from the first sub memory cell array and the second sub memory cell array;
   first capacitors, each of the first capacitors connected between a first dummy word line and each of the second bit lines, the first capacitors boosting the second bit lines in response to the first word line enable signal; and
   second capacitors, each of the second capacitors connected between a second dummy word line and each of the first bit lines, the second capacitors boosting the first bit lines in response to the second word line enable signal,
   wherein the memory cell array has an open bit line structure.

2. The memory cell array of claim 1, wherein the memory cell array is configured to execute a ground (GND) precharge scheme.

3. The memory cell array of claim 1, wherein only the first bit lines among the first bit lines and the second bit lines are boosted when the second word line enable signal is activated and only the second bit lines among the first bit lines and the second bit lines are boosted when the first word line enable signal is activated.

4. The memory cell array of claim 1, wherein the first capacitors have different capacitances depending on a distance from a first node to which the first word line enable signal is applied, and the second capacitors have different capacitances depending on a distance from a second node to which the second word line enable signal is applied.

5. The memory cell array of claim 1, wherein the first capacitors have larger capacitances as the distance from the first node increases, and the second capacitors have larger capacitances as the distance from the second node increases.

6. The memory cell array of claim 1, wherein the second bit lines are boosted when data in the first memory cell array connected to the first bit lines are read, and the first bit lines are boosted when data in the second memory cell array connected to the second bit lines are read.

7. The memory cell array of claim 1, wherein the first capacitors are activated in response to a first boosting voltage signal having a voltage level lower than the first word line enable signal, and the second capacitors are activated in response to a second boosting voltage signal having a voltage level lower than the second word line enable signal.

8. The memory cell array of claim 7, further comprising:
a first level shifter that generates the first boosting voltage signal by reducing the voltage level of the first word line enable signal; and
a second level shifter that generates the second boosting voltage signal by reducing the voltage level of the second word line enable signal.

9. The memory cell array of claim 7, wherein the first capacitors have different capacitances depending on the distance from the first node and the second capacitors have different capacitances depending on the distance from the second node.

10. The memory cell array of claim 1, wherein the first capacitors and the second capacitors include MOS transistors which provide gate capacitances of the MOS transistors or overlap capacitances of the MOS transistors.

11. A semiconductor memory device comprising:
a memory cell array configured, when first data in true cells connected to bit lines are read, to increase a voltage level of complementary bit lines connected to complementary cells and then sense and amplify the first data;
a selecting circuit configured to selectively provide output data of the memory cell array in response to a column selecting signal;
an input/output (I/O) sense-amplifier configured to amplify output data of the selecting circuit; and
an I/O buffer configured to buffer output data of the I/O sense-amplifier and generate output data,
wherein the memory cell array comprises:
a first sub memory cell array that is activated in response to a first word line enable signal,
a second sub memory cell array that is activated in response to a second word line enable signal;
a sense-amplifier/precharge circuit connected to the first sub memory cell array through first bit lines and the second sub memory cell array through second bit lines, the sense-amplifier/precharge circuit configured to precharge the first bit lines and the second bit lines and amplify data provided from the first sub memory cell array and the second sub memory cell array;
first capacitors, each of the first capacitors connected between a first dummy word line and each of the second bit lines, the first capacitors boosting the second bit lines in response to the first word line enable signal; and
second capacitors, each of the second capacitors connected between a second dummy word line and each of the first bit lines, the second capacitors boosting the first bit lines in response to the second word line enable signal.

12. The semiconductor memory device of claim 11, wherein the memory cell array has on open bit line structure.

13. The semiconductor memory device of claim 11, wherein the memory cell array is configured to execute a ground (GND) precharge scheme.

14. The semiconductor memory device of claim 11, wherein the semiconductor memory device is configured, when second data in complementary cells connected to complementary bit lines are read, to increase a voltage level of bit lines connected to true cells and then sense the second data.

15. The semiconductor memory device of claim 11, wherein the first capacitors have different capacitances depending on the distance from a first node to which the first word line enable signal is applied, and the second capacitors have different capacitances depending on the distance from a second node to which the second word line enable signal is applied.

16. The semiconductor memory device of claim 11, wherein the first capacitors have larger capacitances as the distance from the first node increases, and the second capacitors have larger capacitances as the distance from the second node increases.

17. The semiconductor memory device of claim 11, wherein the first bit lines are boosted when the second word line enable signal is activated, and the second bit lines are boosted when the first word line enable signal is activated.

18. The semiconductor memory device of claim 11, wherein the first capacitors are activated in response to a first boosting voltage signal having a voltage level lower than the first word line enable signal, and the second capacitors are activated in response to a second boosting voltage signal having a voltage level lower than the second word line enable signal.

19. The semiconductor memory device of claim 18, wherein the memory cell array comprises:
a first level shifter that generates the first boosting voltage signal by reducing the voltage level of the first word line enable signal; and
a second level shifter that generates the second boosting voltage signal by reducing the voltage level of the second word line enable signal.

* * * * *